US011393998B2

(12) United States Patent
Thompson

(10) Patent No.: US 11,393,998 B2
(45) Date of Patent: Jul. 19, 2022

(54) DOPED ORGANIC CARRIER TRANSPORT MATERIALS

(71) Applicant: The University of Southern California, Los Angeles, CA (US)

(72) Inventor: Mark E. Thompson, Los Angeles, CA (US)

(73) Assignee: The University of Southern California, Los Angeles, CA (US)

( * ) Notice: Subject to any disclaimer, the term of this patent is extended or adjusted under 35 U.S.C. 154(b) by 433 days.

(21) Appl. No.: 16/449,787

(22) Filed: Jun. 24, 2019

(65) Prior Publication Data

US 2019/0312206 A1 Oct. 10, 2019

Related U.S. Application Data

(62) Division of application No. 14/590,603, filed on Jan. 6, 2015, now Pat. No. 10,333,070, which is a division of application No. 10/510,898, filed as application No. PCT/US02/27202 on Aug. 27, 2002, now Pat. No. 8,932,730.

(60) Provisional application No. 60/370,676, filed on Apr. 8, 2002.

(51) Int. Cl.
*H01L 51/50* (2006.01)
*H01L 51/00* (2006.01)
*C09K 11/06* (2006.01)
*H05B 33/14* (2006.01)

(52) U.S. Cl.
CPC .......... *H01L 51/506* (2013.01); *C09K 11/06* (2013.01); *H01L 51/0052* (2013.01); *H01L 51/0053* (2013.01); *H01L 51/0067* (2013.01); *H01L 51/0072* (2013.01); *H01L 51/0077* (2013.01); *H01L 51/0083* (2013.01); *H01L 51/0084* (2013.01); *H01L 51/5048* (2013.01); *H05B 33/14* (2013.01); *C09K 2211/1011* (2013.01); *C09K 2211/1029* (2013.01); *C09K 2211/183* (2013.01); *C09K 2211/185* (2013.01); *C09K 2211/187* (2013.01); *C09K 2211/188* (2013.01); *H01L 51/002* (2013.01); *H01L 51/0035* (2013.01); *H01L 51/0051* (2013.01); *H01L 51/0059* (2013.01); *H01L 51/0085* (2013.01); *H01L 51/0087* (2013.01); *H01L 51/0091* (2013.01); *H01L 51/0092* (2013.01); *H01L 51/5076* (2013.01); *Y10S 428/917* (2013.01)

(58) Field of Classification Search
None
See application file for complete search history.

(56) References Cited

U.S. PATENT DOCUMENTS

| | | |
|---|---|---|
| 4,066,569 A | 1/1978 | Lim |
| 4,618,453 A | 10/1986 | Kim |
| 4,720,432 A | 1/1988 | Vanslyke |
| 5,061,569 A | 10/1991 | Vanslyke |
| 5,110,835 A | 5/1992 | Walter |
| 5,247,226 A | 9/1993 | Sato |
| 5,292,811 A | 3/1994 | Murata |
| 5,292,881 A | 3/1994 | Berneth |
| 5,556,524 A | 9/1996 | Albers |
| 5,811,833 A | 9/1998 | Thompson |
| 5,853,906 A | 12/1998 | Hsieh |
| 6,350,534 B1 | 2/2002 | Boerner |
| 7,078,113 B2 | 7/2006 | Thompson |
| 7,169,483 B2 | 1/2007 | Lewis |
| 7,186,355 B2 | 3/2007 | Swager |
| 7,981,328 B2 | 7/2011 | Kahn |
| 2001/0051285 A1 | 12/2001 | Shi |
| 2002/0113545 A1 | 8/2002 | Adachi |
| 2003/0059647 A1 | 3/2003 | Thompson |
| 2003/0118865 A1 | 6/2003 | Marks |
| 2003/0170491 A1 | 9/2003 | Liao |
| 2009/0309487 A1 | 12/2009 | Royster, Jr. |

FOREIGN PATENT DOCUMENTS

| | | |
|---|---|---|
| EP | 1011155 | 6/2000 |
| EP | 1011155 A2 | 6/2000 |

OTHER PUBLICATIONS

Gao et al "Controlled p doping of the hole-transport molecular material N,N'-diphenyl-N,N'-bis(1-naphthyl)-1,1'-biphenyl-4,4'-donne with tetrafluorotetracyanoquinodimethane", Journal of Applied Physics, vol. 94, No. 1, pp. 359-366 (Jul. 1, 2003).

Sworakowski et al., "On the reliability of determination of energies of HOMO and LUMO levels . . . ", Organic Electronics, vol. 33 (2016), pp. 300-310, and 25 page supplementary data appendix.

Zhou et al., "Very-low-operating-voltage organic light-emitting diodes using a p-doped amorphous hole injection layer", Applied Physics Letters, vol. 78, No. 4, pp. 410-412 (Jan. 22, 2001).

*Primary Examiner* — Gregory D Clark
(74) *Attorney, Agent, or Firm* — Riverside Law LLP

(57) ABSTRACT

The present invention provides for organometallic and organic dopants suitable for use in organic carrier transporting materials. Also provided are organic light emitting devices containing doped organic carrier transporting materials.

9 Claims, No Drawings

DOPED ORGANIC CARRIER TRANSPORT MATERIALS

CROSS-REFERENCE TO RELATED APPLICATIONS

The present application is a divisional of U.S. patent application Ser. No. 14/590,603, filed Jan. 6, 2015, now allowed, which is a divisional of U.S. patent application Ser. No. 10/510,898, filed May 25, 2005, now U.S. Pat. No. 8,932,730, which is a U.S. National Stage Entry of International Patent Application No. PCT/US2002/027202, filed Aug. 27, 2002, which claims priority to, and the benefit of, U.S. Provisional Patent Application No. 60/370,676, filed Apr. 8, 2002, all of which are incorporated herein by reference in their entireties.

FIELD OF THE INVENTION

The present invention pertains to the field of doped organic charge transporting materials and organic light emitting devices containing such materials.

BACKGROUND OF THE INVENTION

Of the known electronic display technologies, organic light emitting devices (OLEDs) are of considerable interest for their potential role in the development of full color, flat-panel display systems. OLEDs are comprised of several organic layers in which at least one of the layers can be made to electroluminesce by applying a voltage across the device (see, e.g., Tang, et al., *Appl. Phys. Lett.* 1987, 51, 913 and Burroughes, et al., *Nature,* 1990, 347, 359). When a voltage is applied across a device, holes and electrons migrate toward their respective oppositely charged electrodes. Recombination of the hole and electron is accompanied by radiative emission, thereby producing electroluminescence.

Movement of charge across an OLED is typically facilitated by inclusion of organic carrier transport layers. Organic materials used in this capacity generally are characterized as having high charge mobility and a low barrier to charge injection. Despite these favorable charge transporting characteristics, conductivity remains relatively low, especially in comparison to doped inorganic semiconductor devices. Consequently, OLEDs often have undesirable high operating voltages.

In contrast with doped inorganic semiconductor light emitting diodes or lasers, nominally undoped OLEDs have low intrinsic carrier concentrations. Intentional doping of the organic charge transporting layer has been studied as a possible means for remedying this deficiency and improving conductivity and power efficiency. p-Type doping of organic hole transporting materials with the organic compound tetrafluoro-tetracyano-quinodimethane ($F_4$-TCNQ) has been reported in Blochwitz, et al., *Appl. Phys. Lett.,* 1998, 73, 729; Pfeiffer, et al., *Appl. Phys. Lett.,* 1998, 73, 3202; Zhou, et al., *Appl. Phys. Lett.,* 2001, 78, 410; and Blochwitz, et al., *Organic Electronics,* 2001, 2, 97. Similarly, n-type doping is the subject of Nollau, et al., J. Appl. Phys., 2000, 87, 4340 which reports doping of naphthalenetetracarboxylic dianhydride (NTCDA) with bis(ethylenedithio)-tetrathiafulvalene (BEDT-TTF). OLEDs containing both p- and n-type doped hole and electron transporting layers, respectively, are reported in Huang, et al., *Appl. Phys. Lett.,* 2002, 80, 139. Doped polymeric hole transporting layers are reported in Yamamori, et al., *Appl. Phys. Lett.* 1998, 72, 2147; Yamamori, et al., *J. Appl. Phys.,* 1999, 86, 4369; and JP 11283750. Electron transporting layers doped with metals are reported in Kido, et al., *Appl. Phys. Lett.,* 1998, 73, 2866; WO 01/41513; EP 1089361; and EP 1011155.

Currently, few compounds have been identified as suitable for enhancing conductivity in OLEDs. Known dopants are typically useful only in combination with a narrow range of organic charge transporting materials. In this regard, new dopants are needed, including more versatile dopants, that can be readily adjusted or "tuned" to energetically fit with any given charge transporting material. Identification of new dopants can result in improved OLEDs having higher power efficiency, lower driving voltages, more efficient charge injection, and improved conductivity. The compositions, methods, and devices described herein help fulfill these and other needs.

SUMMARY OF THE INVENTION

The present invention provides charge transporting materials comprising an organic matrix and an organometallic dopant, where the charge transporting material has a higher conductivity than undoped organic matrix.

The present invention further provides for electron transporting materials comprising an organic matrix and an organometallic dopant, where the dopant is capable of transferring electrons to the organic matrix, and where the electron transporting material has a higher conductivity than undoped organic matrix.

In other embodiments, the present invention provides hole transporting materials comprising an organic matrix and an organometallic dopant, where the dopant is capable of transferring holes to the organic matrix, and where the hole transporting material has higher conductivity than undoped organic matrix.

The present invention also provides methods for selecting an organometallic dopant for increasing conductivity of an organic matrix of an electron transporting material, comprising determining the ionization potential of the dopant determining the LUMO energy level of the organic matrix; and selecting the dopant if the ionization potential is lower than the LUMO energy level, or if the ionization potential is within about 0 to about 0.5 eV of the LUMO energy level.

Similarly, the present invention also provides methods for selecting an organometallic dopant for increasing conductivity of an organic matrix of a hole transporting material, comprising: determining the ionization potential of the organic matrix; determining the LUMO energy level of the dopant; and selecting the dopant if the ionization potential is lower than the LUMO energy level, or if the ionization potential is within about 0 to about 0.5 eV of the LUMO energy level.

Further provided by the present invention are charge transporting materials comprising an organic matrix and a dopant, where the dopant is an organometallic compound comprising at least one cyclopentadienyl ligand optionally substituted by one or more substituents selected from H, an electron withdrawing substituent, or an electron donating substituent.

According to other embodiments, the present invention provides charge transporting materials comprising an organic matrix and a dopant, where the dopant is an organometallic compound comprising at least one arene ligand optionally substituted by one or more substituents selected from H, an electron withdrawing substituent, or an electron donating substituent.

In yet other embodiments, the present invention provides charge transporting materials comprising an organic matrix and a dopant, where the dopant is an organometallic compound comprising at least one carborane ligand optionally substituted by one or more substituents selected from H, an electron withdrawing substituent, or an electron donating substituent.

The present invention further provides charge transporting materials comprising an organic matrix and a dopant, where the dopant is a metallocene having the formula $M(L^1)(L^2)$, wherein $L^1$ has the formula:

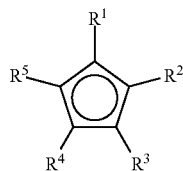

and $L^2$ has the formula:

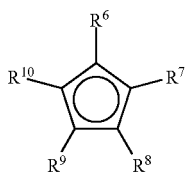

wherein:

each $R^1$, $R^2$, $R^3$, $R^4$, $R^5$, $R^6$, $R^7$, $R^8$, $R^9$, and $R^{10}$ is, independently, H, an electron withdrawing substituent, or an electron donating substituent; and M is a metal atom.

The present invention further provides charge transporting materials comprising an organic matrix and a dopant, where the dopant has the formula $M(Ar)_4$, wherein M is a metal atom, Ar is an aryl group substituted by one or more $R^{11}$, wherein each $R^{11}$ is, independently, H, an electron withdrawing substituent, or an electron donating substituent.

Further provided by the present invention are charge transporting materials comprising an organic matrix and a dopant, where the dopant has the formula:

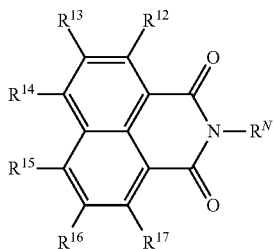

wherein each $R^{12}$, $R^{13}$, $R^{14}$, $R^{15}$, $R^{16}$, $R^{17}$, and $R^N$ is, independently, H, an electron withdrawing substituent, or an electron donating substituent.

The present invention further provides charge transporting materials comprising an organic matrix and a dopant, where the dopant is incapable of transferring charge to the organic matrix except when the dopant is optically excited.

Also provided by the present invention are organic light emitting devices comprising any charge transporting materials described above.

In yet further embodiments, the present invention provides methods for increasing the power efficiency of an organic light emitting device comprising incorporating in the device any charge transporting material described above.

DETAILED DESCRIPTION OF PREFERRED EMBODIMENTS

The present invention provides for, inter alia, charge (carrier) transporting materials containing an organic matrix (or host) material into which an organic or organometallic compound is doped. Doping can effectively increase the number of carriers in the charge transporting material, leading to improved or higher conductivity relative to undoped organic matrix. Ultimately, the doped materials can help increase power efficiencies of OLEDs and improve operation of other electronic devices by providing a route for lower resistance and, hence, lower voltage operation.

Organic matrix material typically contains one or more substances that facilitate either electron or hole transport. Materials suitable as organic matrix for use in the doped hole transporting materials of the present invention include any material that is recognized by one skilled in the art to function as a charge transporting material. Such materials typically show high charge mobility, having low reorganizational barriers to redox events. Organic matrix can include organic compounds or compounds having an organic component, such as, for example, metal complexes having one or more organic ligands. Organic matrix can also include polymers, such as those derived from molecular starting materials.

As with any chemical substance, organic matrix that is considered "pure" or "undoped" can still contain small amounts of impurities. Unlike for an impurity, however, a dopant is intentionally added to a substance, usually to achieve a certain property or result. Accordingly, as used throughout, the phrase "undoped organic matrix" refers to matrix material in that not intentionally doped.

Organic matrix suitable for transporting holes can be, or contain, compounds that are readily oxidized and show little or no structural change upon oxidation. Suitable materials for organic matrix of hole transporting material can include, for example, triarylamines, phthalocyanines, metal phthalocyanines, porphryins, metal porphyrins, indolocarbazoles, metal complexes, iminostilbene containing compounds, or carbazole containing compounds. Triaryl amines such as N,N'-diphenyl-N,N'-bis(3-methylphenyl)1-1'biphenyl-4,4'diamine (TPD), 4,4'-bis[N-(1-naphthyl)-N-phenyl-amino]biphenyl (α-NPD), 4,4'-bis[N-(2-naphthyl)-N-phenyl-amino]biphenyl (β-NPD), and the like, are some examples of compounds suitable as organic matrix in hole transporting materials of the present invention. In some embodiments, metal complexes may also be used as organic matrix. Some suitable metal complexes are described, for example, in U.S. Application Ser. No. 60/283,814, filed Apr. 13, 2001, which is incorporated herein by reference in its entirety. Further, organic matrix suitable for transporting holes can include polymers such as polyvinylcarbazoles, polyphenylenevinylenes, triarylamine pendent polymers, and others.

Similarly, compounds suitable as organic matrix for transporting electrons are numerous and typically include compounds that are readily reduced and show little or no structural change upon reduction. Accordingly, suitable electron transporting materials can include, for example, unsaturated hydrocarbons (carbocyclic and open chain), unsaturated N- and O-containing heterocycles, and metal complexes. Representative unsaturated hydrocarbons include cyclooctatetraenes, cyclopentadienes, siloles, and the like. An example of a cyclooctatetraene is octaphenyl-cyclooctatetraene. Representative unsaturated N- and O-containing heterocycles include phenanthrolines, carbazoles, oxidiazoles, triazoles, triazines, imidazoles, benzimidazoles, and the like. An example of a phenanthroline is bathocuprione. An example of a carbazole is 4,4'-dicarbazolyl-biphenyl. An example of a triazole is 3-phenyl-4-1-naphthyl-5-phenyl-1,2,4-triazole. An example of an oxidiazole is 3-(p-tertiary butyl-phenyl)-4-(p-biphenyl)-1,2-oxidiazole. Other unsaturated heterocycles are also suitable, such as, for example, thiophene and oligothiophene. Some suitable metal complexes can include, for example, metal quinolates such as aluminum tris(8-hydroxyquinolate) ($Alq_3$), zirconium tetra(8-hydroxyquinoline), hafnium tetra (8-hydroxyquinoline), and the like. Suitable organic matrix materials also include organometallic complexes in general, including tetraaryl metal complexes. Further, organic matrix suitable for transporting electrons can include polymers such as cyano substituted polyphenylenevinylenes and oxidiazole- and triazole-containing polymers.

The organic matrix can be doped with a compound that increases conductivity of undoped organic matrix. While not wishing to be bound by theory, it is believed that such dopants function in a manner analogous to that of n- and p-type dopants of inorganic semiconductors (e.g., Si). That is to say, the dopant effectively transfers electrons (or holes) to the matrix material, thereby increasing the overall charge density of the conducting matrix. Accordingly, the relative energetics of the dopant and matrix govern electron transfer from one to the other and, hence, the type of doping that can be achieved. For n-type doping, dopant acts as an electron donor by transferring electrons to the matrix (i.e., reducing the matrix). Conversely, in p-type doping, electrons are transferred from matrix to dopant (i.e., holes are transferred from dopant to matrix; the dopant effectively oxidizes the matrix). The material donating electrons can be considered a donor and the material receiving electrons can be considered an acceptor.

Whether a donor will or will not transfer electrons to an acceptor, as well as the degree of transfer, can be determined by comparison of the energy levels of the HOMO and LUMO of the donor and acceptor, respectively. For example, if the energy of the donor HOMO is above that of the acceptor's LUMO, electron transfer from donor to acceptor can occur. Electron transfer can also occur when the HOMO energy level of the donor is below that of the LUMO energy level of the acceptor, so long as the difference in energy is sufficiently small so as to allow some thermal population of the higher energy orbital.

The HOMO energy level is related to, and can be derived from, ionization potential. For example, higher HOMO energy levels (shallower) correspond to a lower ionization potential because it would take less energy to remove an electron from the molecule. Ionization potential can be measured by techniques well known in the art such as, for example, UPS. Thus, in some embodiments, ionization potential can be used as an estimate of HOMO energy. Accordingly, degree of electron transfer from donor to acceptor, can be determined by comparison of ionization potential of the donor with the LUMO energy level of the acceptor. For example, if the ionization potential of the donor is less than the energy level of the acceptor's LUMO, electron transfer from donor to acceptor can occur. Electron transfer can also occur when the ionization potential of the donor is greater than the LUMO energy level of the acceptor, so long as the difference in energy is sufficiently small so as to allow some thermal population of the higher energy orbital.

In this respect, for electron transporting materials, dopant can be selected such that electron transfer can occur from dopant to matrix. Thus, according to some embodiments, the energy level of the HOMO of the dopant can be above that of the energy level of the matrix LUMO. For example, the HOMO of the dopant can be about 0.05, 0.1, 0.2, 0.3, 0.4, 0.5, 1 eV, or greater in energy than the LUMO energy level of the matrix. Accordingly, dopant can have an ionization potential lower than the LUMO energy level of the organic matrix. Ionization potential can be lower by any amount of energy, such as, for example, about 0.05, 0.1, 0.2, 0.3, 0.4, 0.5, 1 eV, or more.

According to some electron transporting materials of the present invention, the energy level of the HOMO of the dopant can be substantially the same as, or near the energy level of the LUMO of the matrix. In this regard, the difference between the respective HOMO and LUMO energy levels can range, for example, from about 0 to about 0.5 eV, about 0 to about 0.3 eV, about 0 to about 0.2 eV, about 0 to about 0.1 eV, or and even smaller range. In other embodiments, ionization potential of the dopant can be close to or near the energy level of the LUMO of the matrix. For example, the ionization potential of the dopant can be within about 0 to about 0.5 eV, about 0 to about 0.3 eV, about 0 to about 0.2 eV, or about 0 to about 0.1 eV of the LUMO energy level of the matrix.

Conversely, for hole transporting materials, dopant can be selected such that electron transfer occurs from matrix to dopant (i.e., holes are transferred from dopant to matrix). Thus, according to some embodiments, the energy level of the HOMO of the matrix can be above that of the energy level of the LUMO of the dopant. For example, the HOMO energy level of the matrix can be greater by about 0.05, 0.1, 0.2, 0.3, 0.4, 0.5, or 1 eV, or more, than the LUMO energy level of the dopant. Similarly, according to some hole transporting materials of the present invention, matrix can have an ionization potential less than the LUMO energy level of the organic matrix. In this regard, ionization potential can be lower by any amount of energy, such as, for example, about 0.05, 0.1, 0.2, 0.3, 0.4, 0.5, 1 eV, or more.

In other embodiments, the energy level of the HOMO of the matrix can be substantially the same as, or near the energy level of the LUMO of the dopant. In this regard, the difference between the respective HOMO and LUMO energy levels can range, for example, from about 0 to about 0.5 eV, about 0 to about 0.3 eV, about 0 to about 0.2 eV, about 0 to about 0.1 eV, or even smaller. In other embodiments, ionization potential of the matrix can be close to or near the energy level of the LUMO of the dopant. For example, the ionization potential of the matrix can be within about 0 to about 0.5 eV, about 0 to about 0.3 eV, about 0 to about 0.2 eV, or about 0 to about 0.1 eV of the LUMO energy level of the dopant.

The HOMO and LUMO energy levels for various compounds, can be measured, or estimated, according to several techniques known in the art. The two common methods for estimating HOMO energy levels include solution electrochemistry, such as cyclic voltammetry, and ultraviolet photoelectron spectroscopy (UPS). Two methods for estimating LUMO levels include solution electrochemistry and inverse photoemission spectroscopy.

Cyclic voltammetry is one of the most common methods for determining oxidation and reduction potentials of compounds. This technique is well known to those skilled in the art. A test compound is dissolved along with a high concentration of electrolyte. Electrodes are inserted and the voltage scanned in either the positive or negative direction (depending on whether an oxidation or reduction is being performed). The presence of a redox reaction is indicated by current flowing through the cell. The voltage scan is then reversed and the redox reaction is reversed. The reference can be an external electrode, such as Ag/AgCl or SCE, or it can be an internal one, such as ferrocene, which has a known oxidation potential. The latter is often preferred for organic solvents, since the common reference electrodes are water based. A useful parameter that may come from cyclic voltammetry is the carrier gap. If both the reduction and oxidation are reversible, one can determine the energy difference between the hole and the electron (i.e. taking an electron out of the HOMO versus putting one into the LUMO). This value can be used to determine the LUMO energy from a well defined HOMO energy. Methods for determining redox potentials and reversibility of redox events using cyclic voltammetry are well known in the art.

UPS is an alternative technique for determining absolute binding energies in the solid state. Although solution electrochemistry is typically adequate for most compounds, and for giving relative redox potentials, the measurements taken in the solution phase can differ from values in the solid phase. A preferred method of estimating HOMO energies, or ionization potentials, in the solid state is UPS. This is a photoelectric measurement, where the solid is irradiated with UV photons. The energy of the photons are gradually increased until photogenerated electrons are observed. The onset of ejected electrons gives the energy of the HOMO. The photons at that energy have just enough energy to eject an electron from the top of the filled levels. UPS provides HOMO energy level values in eV relative to vacuum which corresponds to the binding energy for the electron.

Inverse photoemission may be used to directly estimate LUMO energy levels. This technique involves pre-reducing the sample and then probing the filled states to estimate the LUMO energies. More specifically, a material is injected with electrons which then decay into unoccupied states and emit light. By varying the energy of the incoming electrons and the angle of the incident beam, electronic structure of a material can be studied. Methods of measuring LUMO energy levels using inverse photoemission are well known to those skilled in the art.

According to embodiments of the present invention, the doped organic matrix has higher, or improved, conductivity relative to undoped organic matrix. Conductivity of charge transporting materials can be measured by any means available in the art. For example, conductivity of a substance can be determined by measuring resistivity between two leads affixed across the substance. Alternatively, a four probe method involves passing a fixed current across a substance between a first pair of leads and then measuring the voltage drop between a second pair of leads situated between the first pair. In this way, the measurement is independent of the resistance in the leads and the relationship V=IR applies.

Suitable dopants are preferably stable after electron transfer to or from the matrix. For example, suitable dopants of electron transporting materials preferably remain stable when oxidized. Similarly, suitable dopants of hole transporting materials preferably remain stable when reduced. By the term "stable" is meant that dopants undergo little or no decomposition or chemical changes (such as structural rearrangement) after oxidation or reduction. Alternatively, if dopants undergo decomposition upon oxidation or reduction, it is preferred that the decomposition products be benign or redox inactive materials that preferably do not interfere with, or alter, charge conduction in the matrix material. It is also preferred that dopants be thermally stable, for example, up to temperatures typically encountered in organic light emitting devices, such as for example, about 100, 200, or 300° C.

Dopants can be present in the organic matrix material in an amount sufficient to increase conductivity relative to undoped organic matrix. Dopant quantities can range, for example, from about 0.001 to about 50% by weight. According to some embodiments, organic matrix is doped, for example, from about 0.05 to about 25, 0.05 to about 10, or from 0.05 to about 1% by weight. The more efficient the charge transfer between dopant and matrix, the less dopant is required to obtain the desired increase in conductivity.

Additionally, dopant can be covalently attached to the organic matrix. For example, dopant can be a substituent attached to a polymeric organic matrix. Accordingly, the level of such doping can be controlled by the amount of substitution on the polymeric organic matrix. Techniques for the attachment of dopant to polymeric organic matrix are well known in the art.

Dopants, in accordance with embodiments of the present invention, can be redox tuned. By "redox tuning" is meant the raising or lowering of redox potentials, and, hence, HOMO/LUMO energy levels, by chemical modification of select chemical components of the dopants. For example, a metal-containing dopant can be redox tuned by variation of a metal atom component while keeping the basic structure (e.g., coordination geometry, etc.) of the molecule substantially the same. Similarly, variation of chemical substituents on ligands or organic molecules can also be used in redox tuning. Possessing multiple sites amendable to substitution or replacement, organometallic compounds can be readily tuned. For example, both metal and ligand sites can be varied, allowing multiple degrees of control in designing a dopant having a desired redox potential. Organic compounds having numerous substitutable sites can also allow precise redox tuning. Accordingly, sets of organic and organometallic dopants can be constructed having different substitutions and representing a range of HOMO/LUMO energies. Thus, for any given organic matrix, dopants can be selected or designed according to the HOMO or LUMO energy levels desired for improving the conducting properties of the matrix.

Accordingly, the present invention provides for methods of selecting a dopant for increasing the conductivity of an organic matrix of an electron transporting material. The method comprises determining the ionization potential of the dopant; determining the LUMO energy level of the organic matrix; and selecting the dopant if the ionization potential is lower than the LUMO energy level, or if the ionization potential is within about 0 to about 0.5 eV of the LUMO energy level. The method can also include the optional steps of determining the stability of oxidized dopant, and selecting the dopant if it is stable in oxidized form.

Conversely, the present invention provides for methods of selecting a dopant for increasing the conductivity of an organic matrix of a hole transporting material. The method comprises determining the ionization potential of the matrix; determining the LUMO energy level of the dopant; and selecting the dopant if the ionization potential is lower than the LUMO energy level, or if the ionization potential is within about 0 to about 0.5 eV of the LUMO energy level. The method can also include the optional steps of determining the stability of reduced dopant, and selecting the dopant if it is stable in reduced form.

The present invention provides for, inter alia, charge transporting materials, such as electron transporting materials and hole transporting materials, containing an organic matrix and an organometallic dopant. As used herein, the term "organometallic" refers to compounds containing at least one metal-carbon bond. According to some embodiments, organometallic compounds include one, two, three, or four ligands that each form a metal-carbon bond. Organometallic compounds are well recognized in the art and their chemistry well developed. An overview of organometallic chemistry and examples of organometallic compounds can be found, for example, in Miessler, et al., *Inorganic Chemistry*, $2^{nd}$ ed., Prentice Hall, Upper Saddle River, N.J., Chapter 13; *Comprehensive Organometallic Chemistry: The Synthesis, Reactions and Structures of Organometallic Compounds*, Vols. 1-9, Wilkinson, ed., Pergamon Press, Oxford, 1982; and *Comprehensive Organometllic Chemistry-II*, Vols. 1-14, Abel, ed., Pergamon Press, Oxford, 1995; each of which is incorporated herein by reference in its entirety.

Ligands (L) that can bind to metals through one or more carbon atoms are numerous, and include, for example, carbonyl, thiocarbonyl, cyanide, isocyanide, carbene, carbyne, acyl, alkyl, alkenyl, alkynyl, ketone, carborane, and aromatic compounds, and others. Bonding between metal and carbon can include sigma bonding, pi bonding, or a combination of both. Many unsaturated ligands can form pi complexes with metals. Examples of such complexes include $\eta^2$-, $\eta^4$-, or $\eta^6$-arene, $\eta^5$-cyclopentadienyl (Cp), $\eta^3$-enyl (such as $\eta^3$-allyl), $\eta^2$-ketone, π-alkene, and π-alkyne (such as π-acetylene) complexes. Examples of organometallic compounds containing these and other ligands are described in, for example, Collman, et al., *Principles and Applications of Organotransition Metal Chemistry*, University Science Books, Mill Vally, Calif., 1987; *Comprehensive Organometallic Chemistry: The Synthesis, Reactions and Structures of Organometallic Compounds*, Vols. 1-9, Wilkinson, ed., Pergamon Press, Oxford, 1982; and *Comprehensive Organometllic Chemistry-II*, Vols. 1-14, Abel, ed., Pergamon Press, Oxford, 1995; each of which is incorporated herein by reference in its entirety.

Organometallic compounds include at least one metal atom (M), including both mononuclear and polynuclear compounds. Polynuclear compounds can include, for example, binuclear, trinuclear, tetranuclear, and higher order clusters. M can be any metal atom, including transition metals, lanthanides, actinides, main group metals, alkali metals and alkaline earth metals. First row transition metals include any of Sc, Ti, V, Cr, Mn, Fe, Co, Ni, Cu, and Zn. Second row transition metals include any of Zr, Nb, Mo, Tc, Ru, Rh, Pd, Ag, and Cd, and third row transition metals include any of La, Hf, Ta, W, Re, Os, Ir, Pt, Au, and Hg. Main group metals include Al, Ga, Ge, In, Sn, Sb, Tl, Pb, Bi, and Po. In many embodiments, M is a transition metal, such as from any of Groups 5, 6, 7, and 8 of the periodic table. In some embodiments, M can be Cr, Fe, Co, Os, or V. Often, heavy metals, such as, for example, the second and third row transition metals, lanthanides, actinides, as well as fourth and fifth row main group metals can provide thermal stability to organometallic compounds.

Organometallic compounds, in addition to having one or more ligands that form metal-carbon bonds, can often include any number of further ligands (X). For example, organometallic compounds can have one, two, three, four, five, or six ligands in addition to those that form metal-carbon bonds. Numerous ligands are known to those skilled in the art and many suitable examples are provided, for example, in Cotton and Wilkinson, *Advanced Inorganic Chemistry*, Fourth Ed., John Wiley & Sons, New York, 1980; *Comprehensive Organometallic Chemistry: The Synthesis, Reactions and Structures of Organometallic Compounds*, Vols. 1-9, Wilkinson, ed., Pergamon Press, Oxford, 1982; and *Comprehensive Organometllic Chemistry-II*, Vols. 1-14, Abel, ed., Pergamon Press, Oxford, 1995; each of which is incorporated herein by reference in its entirety. Further ligands (X) can be monodentate, bidentate, multidentate, π-bonding, organic, inorganic, charged, or uncharged. Ligands often include one or more heteroatoms through which the metal atom can coordinate. Coordinating heteroatoms of the ligands can include oxygen, nitrogen, sulphur, phosphorus, and the like. Nitrogen-containing ligands can include amines, nitrenes, azide, diazenes, triazenes, nitric oxide, polypyrazolylborates, heterocycles such as 2,2'-bipyridine (bpy), 1,10-phenanthroline, terpyridine (trpy), pyridazine, pyrimidine, purine, pyrazine, pyridine, 1,8-napthyridine, pyrazolate, imidazolate, and macrocycles including those with and without a conjugated π system, and the like. Preferred nitrogen-containing ligands include those that contain one or more heterocycles such as pyridine and polypyridyl ligands such as terpyridine (trpy), bipyridine (bpy), and derivatives thereof. Phosphorus-containing ligands typically include phosphines and the like. Oxygen-containing ligands include water, hydroxide, oxo, superoxide, peroxide, alkoxides, alcohols, aryloxides, ethers, ketones, esters, carboxylates, crown ethers, β-diketones, carbamate, dimethylsulfoxide, and oxo anions such as carbonate, nitrate, nitrite, sulfate, sulfite, phosphate, perchlorate, molybdate, tungstate, oxalate and related groups. Sulfur-containing ligands can include hydrogen sulfide, thiols, thiolates, sulfides, disulfides, thioether, sulfur oxides, dithiocarbamates, 1,2-dithiolenes, and the like. Hydrogen and halides can also serve as ligands.

According to embodiments of the present invention, charge transporting materials can contain, as a dopant, an organometallic compound having at least one cyclopentadienyl (Cp, $\eta^5$-$C_5H_5$) ligand, or derivative thereof. In this regard, organometallic complexes having one, two, three, four or more Cp ligands are suitable. Cyclopentadienyl metal complexes are well known in the art and constitute a large body of known organometallic compounds. Synthetic methods for preparing Cp organometallic complexes have been well studied. For example, many Cp metal complexes can be prepared by combining cyclopentadienyl anion with substitution-labile metal halides. Organometallic complexes containing substituted Cp ligands can be typically made in the same manner as for any known Cp complex by replacing Cp with the substituted Cp during synthesis. Cyclopentadienyl organometallic compounds, their chemistry, and methods for their synthesis are described in, for example, Strelets, et al., *Coordination Chemical Reviews*, 1992, 114, 1-60; *Comprehensive Organometallic Chemistry: The Synthesis, Reactions and Structures of Organometallic Compounds*, Vols. 1-9, Wilkinson, ed., Pergamon Press, Oxford, 1982; and *Comprehensive Organometallic Chemistry-II*, Vols. 1-14, Abel, ed., Pergamon Press, Oxford, 1995; and Collman, et al., *Principles and Applications of Organotransition Metal Chemistry*, University Science Books, Mill Vally, Calif., 1987, each of which is incorporated herein by reference in its entirety.

The Cp ligand can be derivatized by incorporating one or more substituents. Substituents can include, for example, H, electron withdrawing substituents, or electron donating substituents. Derivatization can lead to changes in the compounds' electronic properties, by either raising or lowering redox potentials, thereby modifying the HOMO/LUMO energy levels. Substitution of Cp and the preparation of organometallic complexes containing substituted Cp are well known in the art and many Cp derivatives are commercially available. Examples of some known Cp derivatives include pentamethylcylcopentadiene (Cp*), aryl-Cp: $C_5Ar_{5-n}H_n$ (n=1-5), nitro-Cp: $C_5(NO_2)_{5-n}H_n$ (n=3, 4), formyl-Cp: $C_5(CHO)_{5-n}H_n$ (n=3, 4), cyano-CP: $C_5(CN)_{5-n}H_n$ (n=2, 3, 4) and trifluoromethyl-Cp: $C_5(CF_3)_{5-n}H_n$ (n=2, 3, 4). Derivatization of Cp is well described in the literature such as, for example, in *Comprehensive Organometallic Chemistry: The Synthesis, Reactions and Structures of Organometallic Compounds*, Vols. 1-9, Wilkinson, ed., Pergamon Press, Oxford, 1982; and *Comprehensive Organometallic Chemistry-II*, Vols. 1-14, Abel, ed., Pergamon Press, Oxford, 1995, each of which is incorporated herein by reference in its entirety. According to some embodiments, the Cp ligands can include more than one substituent. Ligands having more than one substituent can include any combination of different substituents. For example, Cp ligands can contain any number of, and any combination of, H, electron withdrawing groups, and electron donating groups. Additionally, each Cp ligand, in organometallic compounds having more than one, can be substituted differently. As used herein, the phrases "Cp ligand" and "cyclopentadienyl ligand" are meant to refer to both substituted and unsubstituted versions of the ligand.

Substituents that can serve as electron withdrawing and donating groups are well known in the art. An electron withdrawing group is any group that withdraws, usually inductively, electron density away from the molecule to which it is attached. Conversely, an electron donating group is any group that donates electron density, usually either inductively or by resonance effect, to the molecule to which it is attached. When a substituent is attached to a non-aromatic molecule, electron withdrawing or donating ability is believed to be primarily governed by inductive effects. Thus, the electronegativites of a substituent and the atom to which it is attached can control electron withdrawing or donating ability. When a substituent is attached to an aromatic compound, such as phenyl or the anion of cyclopentadiene, it is believed that a resonance effect contributes to electron withdrawing and donating ability. Often, substituents with a lone pair of electrons act as electron donating substituents because the lone pair can be delocalized onto the aromatic molecule. Thus, halogen substituents, while strongly electronegative, can act as electron donating substituents in aromatic systems. Numerous techniques for determining whether a substituent has an electron withdrawing or donating effect are well known in the art. For example, measurements of either or both inductive and resonance effects can be carried out by appropriate spectroscopic methods. Electron withdrawing and donating groups are well described in, for example, March, *Advanced Organic Chemistry*, $3^{rd}$ ed., John Wiley & Sons, New York, 1985.

Some examples of electron withdrawing substituents include aryl, cyano, nitro, carbonyl, aldehyde, carboxylic acid, alkoxycarbonyl, aminocarbonyl, alkylsufonyl, alkoxysulfonyl, nitrosyl, tricyanoethyenyl, and alkyl substituted by halo, such as perfluoroalkyl, to name a few. Halogen can also be electron withdrawing.

Some examples of electron donating groups include alkyl, alkoxy, amino, alkylamino, dialkylamino, mercapto, phosphino, oxo, sulfido, thiolato, amido, hydroxyl, silyl, and alkylcarbonyloxy, to name a few. Halogen can often be electron donating when attached to an aromatic molecule.

Numerous classes of organometallic complexes containing at least one Cp ligand are known and are suitable as dopants according to embodiments of the present invention. One such class includes the metallocenes which are characterized as having a metal atom "sandwiched" between two substantially parallel cyclopentadienyl ligands. Some metallocenes have been prepared using, for example, the metals V, Cr, Mn, Fe, Co, and Ni. Metallocenes are well known in the art and their synthesis, structure, and reactivity are well described in, for example, Togni, et al., *Metallocenes*, Wiley, New York, 1998; Strelets, *Coordination Chemical Reviews*, 1992, 114, 1-60; *Comprehensive Organometallic Chemistry: The Synthesis, Reactions and Structures of Organometallic Compounds*, Vols. 1-9, Wilkinson, ed., Pergamon Press, Oxford, 1982; and *Comprehensive Organometallic Chemistry-II*, Vols. 1-14, Abel, ed., Pergamon Press, Oxford, 1995; Collman, et al., *Principles and Applications of Organotransition Metal Chemistry*, University Science Books, Mill Vally, Calif., 1987, and Cotton, et al., *Advanced Inorganic Chemistry*, Fourth ed., John Wiley & Sons, New York, 1980, each of which is incorporated herein by reference in its entirety.

The oxidation potential of metallocenes can be readily tuned by choice of metal. For example, the oxidation potential of ferrocene ($Cp_2Fe$) is about 0.45 V (v. SCE) with an ionization potential of about 4.8 eV (as measured by UPS). By substituting iron for cobalt, resulting in cobaltocene ($Cp_2Co$), a lower oxidation potential of about −0.94 V (ionization potential of 3.4 eV based on $Cp_2Fe$) can be obtained. Similarly, substituting the Fe in ferrocene with Cr results in a metallocene ($Cp_2Cr$) with a lowered oxidation potential of about −0.55 V (ionization potential of 3.8 eV). As the LUMO energies of typical electron transporting materials can range from about 2.5 to about 4.0 eV, metallocenes can make suitable n-type dopants.

It is also possible to tune the redox properties of metallocenes by substitution of the cyclopentadienyl ligands. Oxidation potential of ferrocene and cobaltocene can be lowered by incorporating electron donating groups, such as methyl substituents, on the Cp ligands. For example, the oxidation potential of ferrocene in which the hydrogens of the Cp ligands have all been replaced with methyl (Cp*) is lowered to about −0.12 V and the corresponding cobaltocene ($Cp^*_2Co$) has an oxidation potential lowered to about −1.47 V, leading to an estimated HOMO energy (or ionization potential) of about 2.9 eV. Similarly, substituting the Cp groups with an electron withdrawing group, such as phenyl, can lead to an increased oxidation potential. Intermediate substitution, i.e., using fewer than five methyl groups per Cp ligand, can give intermediate shifts in redox potential. Thus, by both variation of metal and ligand substitution, a set of metallocenes representing a full range of oxidation potentials, and hence, ionization energies can be accessed. Accordingly, the set of metallocenes can provide at least one dopant having a desirable ionization energy for improving the conductivity for any given charge transporting material, such as, for example, an electron transporting material.

Some metallocene dopants suitable in embodiments of the present invention can be represented by the formula $M(L^1)(L^2)$. $L^1$ and $L^2$ are formally anionic cyclopentadienyl ligands having the formulas designated below.

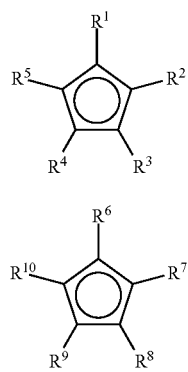

M can be any metal atom. According to some embodiments, M can be a transition metal, such as, for example, Fe, Co, or Cr.

The cyclopentadienyl ligands are substituted by substituents $R^1$, $R^2$, $R^3$, $R^4$, $R^5$, $R^6$, $R^7$, $R^8$, $R^9$, and $R^{1'}$, which can be each, independently, H, an electron withdrawing substituent, or an electron donating substituent. In some embodiments, at least one of $R^1$, $R^2$, $R^3$, $R^4$, $R^5$, $R^6$, $R^7$, R, $R^9$, and $R^{10}$ is an electron withdrawing group or electron donating group. In some embodiments, at least one $R^1$, $R^2$, $R^3$, $R^4$, $R^5$, $R^6$, $R^7$, $R^8$, $R^9$, and $R^{10}$ is alkyl, alkoxy, amino, mercapto, or phosphino. In other embodiments, at least one $R^1$, $R^2$, $R^3$, $R^4$, $R^5$, $R^6$, $R^7$, R, $R^9$, and $R^{10}$ is aryl, cyano, nitro, carbonyl, tricyanoethyenyl, or perfluoroalkyl. In further embodiments, at least one $R^1$, $R^2$, $R^3$, $R^4$, $R^5$, $R^6$, $R^7$, $R^8$, $R^9$, and $R^{10}$ is halogen. Any combination of H, electron withdrawing groups, and electron donating groups can be suitable.

According to some embodiments, the cyclopentadienyl ligands $L^1$ and $L^2$ can be covalently linked by one or more linking groups. Linkage of the two Cp ligands can modify stereochemistry of the metallocene, thereby modifying HOMO/LUMO energy levels and providing another means for tuning redox potential. Any linking group can be suitable, including linking groups having alkyl, aryl, and silyl moieties.

Besides the metallocenes, numerous other organometallic compounds containing at least one cyclopentadienyl ligand can be suitable in embodiments of the present invention. For example, organometallic compounds containing at least one cyclopentadienyl ligand and at least one other ligand (X), such as represented by the formula $M(L^1)_n(X)_m$, can be used as dopants. According to this formula, metal atom M and cyclopentadienyl ligand $L^1$ are as defined hereinbefore. Ligand X can be any ligand as described hereinbefore, including both mono- and polydentate ligands. The number of $L^1$ and X ligands can vary and are designated by n and m respectively. The sum of n and m can range from 2 to about 6. The values for n and m can range from 1 to about 5.

Some examples of organometallic compounds having formula $M(L^1)_n(X)_m$ include those where n is 2. Such complexes can include the so-called "bent sandwich" complexes in which the two cyclopentadienyl ligands are not parallel. "Bent sandwich" compounds are well known in the art and their chemistry is described, for example, in *Comprehensive Organometallic Chemistry: The Synthesis, Reactions and Structures of Organometallic Compounds*, Vols. 1-9, Wilkinson, ed., Pergamon Press, Oxford, 1982; and *Comprehensive Organometallic Chemistry-II*, Vols. 1-14, Abel, ed., Pergamon Press, Oxford, 1995; and Collman, et al., *Principles and Applications of Organotransition Metal Chemistry*, University Science Books, Mill Vally, Calif., 1987; and Cotton, et al., *Advanced Inorganic Chemistry*, Fourth ed., John Wiley & Sons, New York, 1980, Ch. 27, each of which is incorporated herein by reference in its entirety. In many of these complexes, each X can be, independently, for example, halogen, hydrogen, carbonyl, alkyl, or alkenyl. Variable m can range from 1 to about 3. Some examples of $M(L^1)_n(X)_m$ compounds include $Cp_2TiCl_2$, $Cp_2WH_2$, and others.

Some examples of organometallic compounds having formula $M(L^1)_n(X)_m$ include those where n is 1. Such complexes can include the so-called "half sandwich" compounds, many having a "piano stool" structure. The "half sandwich" complexes are well known in the art and well described in, for example, *Comprehensive Organometallic Chemistry: The Synthesis, Reactions and Structures of Organometallic Compounds*, Vols. 1-9, Wilkinson, ed., Pergamon Press, Oxford, 1982; and *Comprehensive Organometallic Chemistry-II*, Vols. 1-14, Abel, ed., Pergamon Press, Oxford, 1995; and Collman, et al., *Principles and Applications of Organotransition Metal Chemistry*, University Science Books, Mill Vally, Calif., 1987, each of which is incorporated herein by reference in its entirety. Examples of such compounds include those where, for example, each X is, independently, carbonyl, nitrosyl, halogen, phosphine, alkyl, or aryl and m can range from 1 to about 4. Some examples of monocyclopentadienyl organometallic compounds include, $CpMo(CO)_3Cl$, $CpMo(CO)_2NO$, $CpMo(CO)_3H$, $CpMo(CO)_3(alkyl)$, and the like.

Other suitable organometallic compounds containing at least one cyclopentadienyl ligand include polynuclear complexes having more than one metal center. For example, polynuclear complexes can be dimers or trimers of any of the above described cyclopentadienyl complexes.

According to some embodiments of the present invention, charge transporting materials can include an organic matrix and a dopant having the formula $M(Ar)_4$. The metal atom M can be any metal atom, including transition metals. Examples of transition metals include metals of Groups 5, 6, 7, or 8. Os or V can be particularly suitable, for example. The synthesis and reactivity of $M(Ar)_4$ compounds is well known in the art.

Ar can be an aryl group substituted by one or more substitutents $R^{11}$. Any aryl group is suitable. Some examples of suitable aryl groups in compounds having the formula $M(Ar)_4$ include phenyl, naphthyl, biphenyl, anthracenyl, and fluorenyl. In many suitable embodiments, each Ar is bonded to M through one atom of the Ar group ($\eta^1$-bonding). According to further embodiments, the four Ar groups can be substituted differently from each other.

Each individual $R^{11}$ can be, independently, H, an electron withdrawing substituent, or an electron donating substituent. Any number of different or the same $R^{11}$ substituents can be present on the aryl group, including various combinations of H, electron withdrawing groups, and electron donating groups. In some embodiments, at least one $R^{11}$ is an electron withdrawing group or an electron donating group. Examples of $R^{11}$ substituents include alkyl, alkoxy, amino, mercapto, or phosphino. Further examples of $R^{11}$ substituents include aryl, cyano, nitro, carbonyl, tricyanoethyenyl, or perfluoroalkyl. $R^{11}$ can also be halogen.

In further embodiments according to the present invention, charge transporting materials can include an organometallic dopant having at least one arene ligand. Arene ligands are typically benzenoid ligands that form pi complexes with metal atoms. η6-Arene complexes are well known in the art and discussed in detail for example, in Cotton, et al., *Advanced Inorganic Chemistry*, Fourth ed., John Wiley & Sons, New York, 1980, Ch. 27, which is incorporated herein by reference in its entirety. As with Cp ligands, arene ligands can be substituted by any number and combination of H, electron withdrawing groups, and electron donating groups. Some examples of organometallic compounds containing at least one arene ligand include, $(C_6H_6)_2Cr$, $(C_6H_6)Cr(CO)_3$, $(C_6(CH_3)_6)_2Mn$, $(C_6H_6)_2Ti$, $(p-C_6H_4F_2)_2V$, $(C_6H_6)_2Nb$, $(C_6H_6)_2W$, $(C_6H_6)_2Ru$, $(C_6H_6)_2Hf(PMe_3)$, and derivatives thereof. η4-Arene complexes can also be suitable.

Suitable organometallic dopants of the present invention can also include at least one heterocylic analog of an arene or cyclopentadienyl ligand. Examples of heterocyclic analogs include the anion of thiophene and derivatives thereof, the anion of pyrrole and derivatives thereof, pyridines, boroles, borazines, borazoles, and substituted derivatives thereof. As with Cp and arene ligands, the heterocyclic analogs can include any number, and any combination, of substituents including H, electron withdrawing groups, and electron donating groups. Organometallic complexes containing heterocyclic analogs of Cp and arene ligands are well known in the art and described, for example, in Cotton, et al., *Advanced Inorganic Chemistry*, John Wiley & Sons, New York, 1980, Ch. 27. Examples of such compounds include $(C_4Ph_4BPh)Ni(CO)_2$ and others.

Suitable organometallic dopants of the present invention can also contain at least one carborane ligand. Some suitable carborane ligands include $B_9C_2H_{11}^{2-}$, $B_7C_2H_{11}^{2-}$, and others. Typically, one or two carborane ligands can coordinate to a metal atom, often in an analogous manner to cyclopentadienyl. Carborane ligands can be readily derivatized to include one or more electron withdrawing groups or electron donating groups. Organometallic compounds containing carborane ligands are well known in the art and their synthesis and reactivity are well described in, for example, Cotton, et al., *Advanced Inorganic Chemistry*, John Wiley & Sons, New York, 1980, Ch. 27, which is incorporated herein by reference in its entirety.

Embodiments according to the present invention further include charge transporting materials containing an organic dopant. In some embodiments, the organic dopant can include naphthylimide derivatives having formula I.

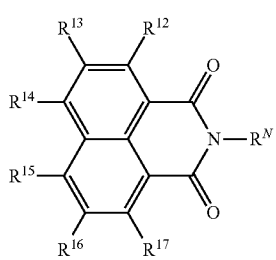

I

Substituents $R^{12}$, $R^{13}$, $R^{14}$, $R^{15}$, $R^{16}$, $R^{17}$, and $R^N$ of the naphthylimide core can be each, independently, H, an electron withdrawing substituent, or an electron donating substituent. Any number of, and any combination of, H, electron withdrawing substituents, or electron donating substituents is suitable. In some embodiments, at least one $R^{12}$, $R^{13}$, $R^{14}$, $R^{15}$, $R^6$, $R^{17}$, and $R^N$ is an electron withdrawing group or an electron donating group. Accordingly, in some embodiments, at least one $R^{12}$, $R^{13}$, $R^{14}$, $R^{15}$, $R^{16}$, $R^{17}$, and $R^N$ is alkyl, alkoxy, amino, mercapto, or phosphino. In other embodiments, at least one $R^{12}$, $R^{13}$, $R^{14}$, $R^{15}$, $R^{16}$, $R^{17}$, and $R^N$ is aryl, cyano, nitro, carbonyl, tricyanoethyenyl, or perfluoroalky. In yet further embodiments, at least one $R^{12}$, $R^{13}$, $R^{14}$, $R^{15}$, $R^{16}$, $R^{17}$, and $R^N$ can be halogen. According to some embodiments, $R^N$ can be aryl, alkyl, perfluoroalkyl, or a substituent of formula II.

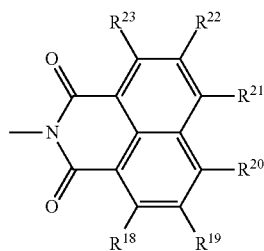

II

Each $R^{18}$, $R^{19}$, $R^{20}$, $R^{21}$, $R^{22}$, and $R^{23}$ can be, independently, H, an electron withdrawing substituent, or an electron donating substituent.

Naphthylimides and other similar organic compounds can be modified by methods well known in the art. For example, in formulas I and II, each $R^{12}$, $R^{13}$, $R^{14}$, $R^{15}$, $R^{16}$, $R^{17}$, $R^N$, $R^{18}$, $R^{19}$, $R^{20}$, $R^{21}$, $R^{22}$, and $R^{23}$ can be substituted or modified by techniques well known in the art.

The naphthylimides of formula I can be used as p-type dopants in hole transporting materials. Unsubstituted naphthylimide (where $R^{12}$, $R^{13}$, $R^{14}$, $R^{15}$, $R^{16}$, $R^{11}$, and $R^N$ are each H) has an estimated LUMO energy of about 4.2 eV (estimated from electrochemical data). Lower LUMO energies can be obtained by substitution with fluoro or other groups such as $NO_2$, CN, $CF_3$, CHO, and the like. Combination of various groups, including both electron withdrawing and electron donating substituents, can effectively tune the naphthylimide redox potential to any desired value appropriate for a given organic matrix.

The present invention further provides for charge transporting materials containing an organic matrix and an organic or organometallic dopant that is incapable of transferring charge to the organic matrix except when the dopant is optically excited. According to some embodiments, the charge transporting material containing such a dopant can be an electron transporting material in which the optically excited dopant reduces the organic matrix. Often, such a dopant is chemically altered after transfer of charge to the matrix such that back electron transfer is prevented. For example, the dopant can structurally rearrange or irreversibly decompose into one or more compounds that have different redox properties from the original dopant molecule. In some embodiments, decomposition products are not redox active and/or are not capable of reversible redox processes. Such dopants can be useful in preparing charge transporting materials in which doping can be switched on by optical excitation. Hence, conductivity and other properties of charge transporting materials, and the properties of devices that include them, can be optically controlled.

Dopants capable of transferring charge to organic matrix upon optical excitation can include both organic and organometallic compounds. According to some embodiments, optically activated dopants are capable of transferring electrons to organic matrix and are thereby suitable in electron transporting materials. Optically activated dopant can include many organometallic compounds such as, for example, Ir, Re, Os, Pt, or Au complexes.

The present invention further provides for organic light emitting devices containing at least one doped charge transporting material. For example, OLEDs can include a charge transporting layer having an organic matrix doped with any of the dopants, or derivatives thereof, described herein. The charge transporting layer can be a hole transporting layer or an electron transporting layer. According to some embodiments, OLEDs can have both doped hole and doped electron transporting layers. OLEDs of the present invention can further include any number of additional layers including, for example, hole injecting, hole blocking, electron injecting, electron blocking, luminescent, and other layers.

Light emitting devices of the present invention can be fabricated by a variety of techniques well known to those skilled in the art. Small molecule layers, including those made of neutral metal complexes and doped materials, can be prepared by vacuum deposition, organic vapor phase deposition (OVPD), such as disclosed in U.S. Pat. No. 6,337,102, which is incorporated herein by reference in it its entirety. Other methods include solution processing such as spin coating or CVD. Layers of charged compounds, such as salts of charged metal complexes, can be prepared by solution methods such a spin coating or by an OVPD method such as disclosed in U.S. Pat. No. 5,554,220, which is incorporated herein by reference in its entirety.

Devices and techniques for OLED fabrication are described throughout the literature and in, for example, U.S. Pat. Nos. 5,703,436; 5,986,401; 6,013,982; 6,097,147; and 6,166,489. For devices from which light emission is directed substantially out of the bottom of the device (i.e., substrate side), a transparent anode material such as ITO may be used as the bottom electron. A top electrode, which is typically a cathode, may be comprised of a thick and reflective metal layer having a high electrical conductivity. Alternatively, for transparent or top-emitting devices, a transparent cathode may be used such as disclosed in U.S. Pat. Nos. 5,703,436 and 5,707,745, each of which is incorporated herein by reference in its entirety. Top-emitting devices may have an opaque and/or reflective substrate, such that light is produced substantially out of the top of the device. Devices can also be fully transparent, emitting from both top and bottom.

Because the doped charge transporting materials can have increased conductivity relative to an undoped organic matrix, the present invention further provides methods for increasing the power efficiency of an organic light emitting device. The methods comprise the step of incorporating into an organic light emitting device one or more of the doped charge transporting materials according to the present invention. For example, efficiency can be improved by including a doped electron transporting material, a doped hole transporting material, or both, in an OLED. Methods for measuring device efficiencies are well known in the art.

Light emitting devices of the present invention can be used in a pixel for a display. Virtually any type of display can incorporate the present devices. Displays can include computer monitors, televisions, personal digital assistants, printers, instrument panels, bill boards, and the like. In particular, the present devices can be used in heads-up displays because they can be substantially transparent when not in use.

As used herein, the terms "lower," "less," and "deeper," in reference to molecular orbital energies, are used interchangeably. These terms generally describe molecular orbitals residing at a lower, or more stable, energy levels. Accordingly, orbitals having energy below that of another orbital are lower in energy. Ionization of electrons from lower energy orbitals requires more energy than ionization of electrons in shallower orbitals (orbitals of greater energy). Thus, although the deeper orbitals are said to be lower, they are often referred to numerically by higher numbers. For example, a molecular orbital residing at 5.5 eV is lower (deeper) than a molecular orbital residing at 2.5 eV. Similarly, the terms "shallower," "greater," and "higher," in reference to orbital energy levels, refer to orbitals residing at less stable energies. Accordingly, orbitals having energy above that of another orbital are higher in energy. These terms are well known to those skilled in the art.

As used herein, the term "alkyl" includes linear, branched, and cyclic alkyl groups. In some embodiments, alkyl groups are $C_1$-$C_{20}$ alkyl groups. Examples of alkyl groups include, methyl, ethyl, n-propyl, isopropyl, n-butyl, isobutyl, cyclohexyl, norbornyl, and the like. "Alkenyl" groups refer to alkyl groups having one or more double bonds, and "alkynyl" groups refer to alkyl groups having one or more triple bonds. "Alkoxy" groups can have from about 1 to about 20 carbon atoms and can include, for example, methoxy, ethoxy, propoxy, n-butoxy, isobutoxy, and the like. "Aryloxy" groups can have from about 3 to about 40 carbon atoms and can include, for example, phenoxy and the like. "Aryl" groups can be any mono- or polycyclic aromatic group, and include "heteroaryl" groups which refers to an aryl group including one or more heteroatoms such as O, S, P or N. Aryl groups can have 3 to about 40 carbon atoms and can include, for example, phenyl, 4-methylphenyl, naphthyl, anthracenyl, phenanthryl, pyridyl, indolyl, benzothiophene, quinolinyl, and the like. "Amino" groups, as used herein, include amino, alkylamino, dialkylamino, arylamino, and diarylamino groups. Examples of amino groups include, $NH_2$, methylamino, dimethylamino, phenylamino, diphenylamino, and the like. "Phosphino" groups, as used herein, include phosphino, alkylphosphino, dialkylphosphino, arylphosphino, and diarylphosphino. Some examples of phosphino groups include $PH_2$, methylphosphino, dimethylphosphino, phenylphosphino, diphenylphosphino, and the like. "Thiolato" groups can have from about 1 to about 20 carbon atoms and can include, for example, thiomethoxy, thiophenoxy, and the like. "Halo" groups include fluoro, chloro, bromo, and iodo, for instance.

As those skilled in the art will appreciate, numerous changes and modifications can be made to the embodiments of the invention without departing from the spirit of the invention. It is intended that all such variations fall within the scope of the invention.

Throughout this specification various groupings are employed to conveniently describe constituent variables of compounds and groups of various related moieties. It is specifically intended that each occurrence of such groups throughout this specification include every possible subcombination of the members of the groups, including the individual members thereof.

It is intended that each of the patents, applications, and printed publications mentioned in this patent document be hereby incorporated by reference in its entirety.

EXAMPLES

Example 1: Electron Transporting Materials

Example matrix/dopant combinations for electron transporting materials of the present invention, according to some embodiments, can include phenanthrenes and/or triazoles as matrix in combination with cobaltenes or chromacenes as dopants.

What is claimed is:

1. A charge transporting material comprising an organic matrix and an organometallic dopant, wherein said charge transporting material has a higher conductivity than undoped organic matrix, said charge transporting material is a hole transporting material and said organometallic dopant comprises at least one cyclopentadienyl ligand or derivative thereof.

2. The charge transporting material of claim 1 wherein said dopant is stable to oxidation or reduction.

3. The charge transporting material of claim 1, wherein said organometallic dopant comprises two or more cyclopentadienyl ligands or derivatives thereof.

4. The charge transporting material of claim 1, wherein said organometallic dopant comprises iron, cobalt, or chromium.

5. The charge transporting material of claim 1, wherein said organic matrix comprises phenanthrene, triazole, or a combination thereof.

6. The charge transporting material of claim 1, wherein the organometallic dopant comprises $Cp_2Co$.

7. The charge transporting material of claim 1, wherein the organometallic dopant comprises $Cp_2Cr$.

8. The charge transporting material of claim 1, wherein the organometallic dopant has an oxidation potential of −0.55 V to −0.94V.

9. The charge transporting material of claim 1, wherein the cyclopentadienyl ligand comprises an electron donating group.

\* \* \* \* \*